United States Patent [19]
Kucharewski, Jr. et al.

[11] Patent Number: 5,530,378
[45] Date of Patent: Jun. 25, 1996

[54] CROSS POINT INTERCONNECT STRUCTURE WITH REDUCED AREA

[75] Inventors: Nicholas Kucharewski, Jr., Pleasanton; David Chiang, Saratoga; Jesse H. Jenkins, IV, Danville, all of Calif.

[73] Assignee: XILINX, Inc., San Jose, Calif.

[21] Appl. No.: 430,207

[22] Filed: Apr. 26, 1995

[51] Int. Cl.$^6$ ............................................. H03K 19/177
[52] U.S. Cl. ................... 326/41; 326/39; 364/491
[58] Field of Search ................... 326/39–41, 44; 340/825.83, 825.85, 825.87; 364/490–491

[56] References Cited

U.S. PATENT DOCUMENTS

| | | | |
|---|---|---|---|
| 4,912,342 | 3/1990 | Wong et al. | 326/41 X |
| 5,028,821 | 7/1991 | Kaplinsky | 307/465 |
| 5,039,885 | 8/1991 | Goetting et al. | 326/41 X |
| 5,241,224 | 8/1993 | Pedersen et al. | 307/465 |
| 5,451,887 | 9/1995 | El Ayat et al. | 326/39 |
| 5,457,410 | 10/1995 | Ting | 326/41 |
| 5,469,003 | 11/1995 | Kean | 326/39 |

*Primary Examiner*—David R. Hudspeth
*Attorney, Agent, or Firm*—Patrick T. Bever; Jeanette S. Harms

[57] ABSTRACT

An erasable programmable logic device (EPLD) includes function blocks connected by a universal interconnect matrix (UIM). The UIM includes both a cross-point circuit and a multiplexer-based (MUX-based) circuit. The cross-point circuit includes intersecting first and second conductors programmably connected by memory cells having control gates connected to the first conductors, drains connected to the second conductors, and sources connected to ground. The MUX-based circuit includes third and fourth conductors programmably connected by pass-gates having first terminals connected to the third conductors, second terminals connected to the fourth conductors, and gates connected to memory cells. The UIM further includes multiple-input multiplexers having first input lines connected to the cross-point circuit, second input lines connected to the MUX-based circuit, and output lines connected to the input lines of the function blocks. The multiple-input multiplexers are programmable to selectively apply signals from either the cross-point circuit or the MUX-based circuit to the function block input lines.

23 Claims, 9 Drawing Sheets

CROSS POINT INTERCONNECT STRUCTURE WITH REDUCED AREA

BACKGROUND OF THE INVENTION

The present invention relates to a programmable logic device (PLD), and in particular to an interconnect structure for an erasable programmable logic device (EPLD).

DESCRIPTION OF THE RELATED ART

Programmable logic devices (PLDs) are a class of integrated circuits which are programmed by a user to perform various logic functions. Logic designers typically use PLDs to implement control logic in electronic systems because they are relatively easy to program and can be reprogrammed when necessary to change their logic. This reprogrammability makes their use in an electronic system's design phase less costly than the custom hardwired or "application specific" integrated circuits (ASICs).

One major class of PLDs includes a set of input pins, a programmable AND plane connected to the input pins, an OR plane connected to output lines of the AND plane, and a set of output pins connected to output lines of the OR plane. The AND plane provides a matrix of programmable connections where each column connects to an input pin and each row forms an output line of the AND plane, called a product term line, which connects to the OR plane. The OR plane is programmable such that each product term line is connectable to columns leading to different output pins. In this configuration, the PLD is called a programmable logic array (PLA). Alternatively, the OR plane may be fixed, such that each product term line is assigned to a particular output pin, in which case the PLD is called a programmable array logic (PAL) device.

The PLDs just described contain two levels of logic (AND and OR) and are capable of implementing logic functions that are representable in "sum of products" form. A sum of products form of a logic function is essentially a set of product terms for each output of the function. Such a logic function is represented in a PLD by programmed connections in the AND and OR planes. Each product term line has a programmable input connection in the AND plane to each input pin and produces a single output value representing the logical AND or "product" of the connected inputs. Usually, both the original input pin value and its complement are available for connection to a product term line. Each output line has a programmable product term connection in the OR plane and provides an output value representing the logical OR or "sum" of the connected product terms.

Recently, PLDs with more complex architectures have been developed. For example, erasable programmable logic devices (EPLDs) include two or more function blocks, each function block structured like the two-level PLDs described above. The function blocks are connected together by an interconnect matrix to provide the desired functionality.

One interconnect matrix type, described in U.S. Pat. No. 5,028,821 and referred to as a cross-point interconnect matrix, includes vertical and horizontal conductors which are connected at every intersection by a programmable element, much like the programmable AND planes described above. An advantage of the cross-point interconnect matrix is that this type of interconnect matrix is fully (100%) routable. That is, a fully-wired cross-point interconnect matrix supports all possible connections from the EPLD inputs to the function blocks, between the function blocks, and from the function blocks to the EPLD outputs. Another advantage is that the cross-point interconnect matrix can provide an additional AND plane whose product term outputs can be used to supplement the logic performed by the function blocks of the EPLD. That is, logic signals can be ANDed together before entering a function block. Unfortunately, the large number of programmable connections connected to each conductor of the cross-point interconnect matrix creates large capacitive loads on the conductors which cause signals to propagate through the interconnect matrix at a relatively slow rate. In addition, the amount of space required for a cross-point interconnect matrix increases exponentially as the complexity of an EPLD increases.

A second type of interconnect matrix, disclosed in U.S. Pat. No. 5,241,224 and referred to as a multiplexer-based (MUX-based) interconnect matrix, includes vertical and horizontal conductors which are connected at selected intersections by pass transistors. In a MUX-based interconnect matrix, signals propagate through the matrix at a faster speed than the cross-point interconnect matrix (described above). Unfortunately, this increased speed is obtained at the expense of full routability. That is, pass transistors connect only a small number of intersection conductors, resulting in an interconnect matrix that may not include the specific connections necessary to route a logic function.

SUMMARY OF THE INVENTION

The present invention is directed to a universal interconnect matrix (UIM) that satisfies the need for a fast, fully-routable erasable programmable logic device (EPLD). In accordance with the present invention, the UIM combines both a multiplexer-based (MUX-based) circuit for fast connections, and a cross-point circuit to ensure full routability. Signals are provided to the function blocks of the EPLD through multiple-input multiplexers (MUXs) which are programmed to pass signals from either the cross-point circuit or the MUX-based circuit of the UIM. This configuration allows PLD users to route as many connections as possible using the faster MUX-based circuit, and employs the slower cross-point circuit only when necessary to route any connections which could not be routed using the MUX-based circuit. Thus, both high speed performance and 100% routability of the EPLD are achievable.

More specifically, an EPLD incorporating the above-described UIM includes a plurality of function blocks. Each function block includes a set of input lines and an output line, wherein each function block is programmable to perform logic functions according to signals provided on the set of input lines. The UIM includes a cross-point (first) circuit including a matrix of intersecting first conductors and second conductors. Each of the first conductors is programmably associated to all of the second conductors by a programmable memory device, e.g. an EEPROM, having a select gate connected to the first conductor, a drain connected to the second conductor, and a source connected to ground. A signal on the second conductor is maintained at a high voltage level until a high voltage signal on the first conductor turns on the EEPROM, thereby connecting the second conductor to ground. The UIM also includes a MUX-based (second) circuit including a matrix of overlapping third conductors and fourth conductors, each of the fourth conductors being programmably connected to selected ones of the third conductors. Each programmable connection between one of the third conductors and one of the fourth conductors is provided by a pass-gate having a first terminal connected to the third conductor, a second terminal connected to the fourth conductor, and a gate connected to a memory cell. Connections are made to the first, and third conductors from EPLD input terminals and feedback lines from the functions blocks. Finally, the UIM includes multiplexers (third circuits), each multiplexer having a first input terminal connected to one of the second conductors, a second input terminal connected to one of the fourth conductors, and an output terminal connected to one of function block inputs. Each multiplexer is programmable to connect either a selected one of the fourth conductors to the input line of the function block (that is, disconnecting the cross-point circuit) or connecting a second conductor (that is, disconnecting the MUX-based interconnect).

In one embodiment of the present invention, the number of first conductors of the cross-point circuit is equal to the number of third conductors of the MUX-based circuit. By maintaining a close relationship between the number of first and third conductors, the probability of achieving full (100%) routability is greatly increased.

In another embodiment, the number of third conductors of the MUX-based circuit is greater than the number of first conductors of the cross-point circuit. By reducing the number of first conductors, the probability of achieving full routability is somewhat reduced; however, by increasing the number of connections routed on the MUX-based circuit, operating speed of the programmed EPLD is improved.

In another embodiment, several function block input signals are provided directly from the MUX-based circuit, while others of the function block input signals are provided from the two-input MUXs. This configuration reduces the number of connections to the cross-point circuit, but increases the operating speed of the programmed EPLD.

In accordance with another aspect of the present invention, an EPLD incorporating the above-described UIM is programmed by routing as many connections as possible using the MUX-based circuit, then routing any remaining connections using the cross-point circuit. This routing procedure ensures that full use of the MUX-based circuit is attained, thereby increasing the operating speed of the programmed EPLD. In addition, critical connections (that is, connections which require small time delays) are routed first using the MUX-based circuit. Once the critical connections are routed, as many non-critical connections as possible are then routed using the MUX-based circuit, then any remaining non-critical connections using the cross-point circuit are routed. This procedure ensures both full use of the MUX-based circuit, and proper routing of critical connections using the MUX-based circuit.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 1:
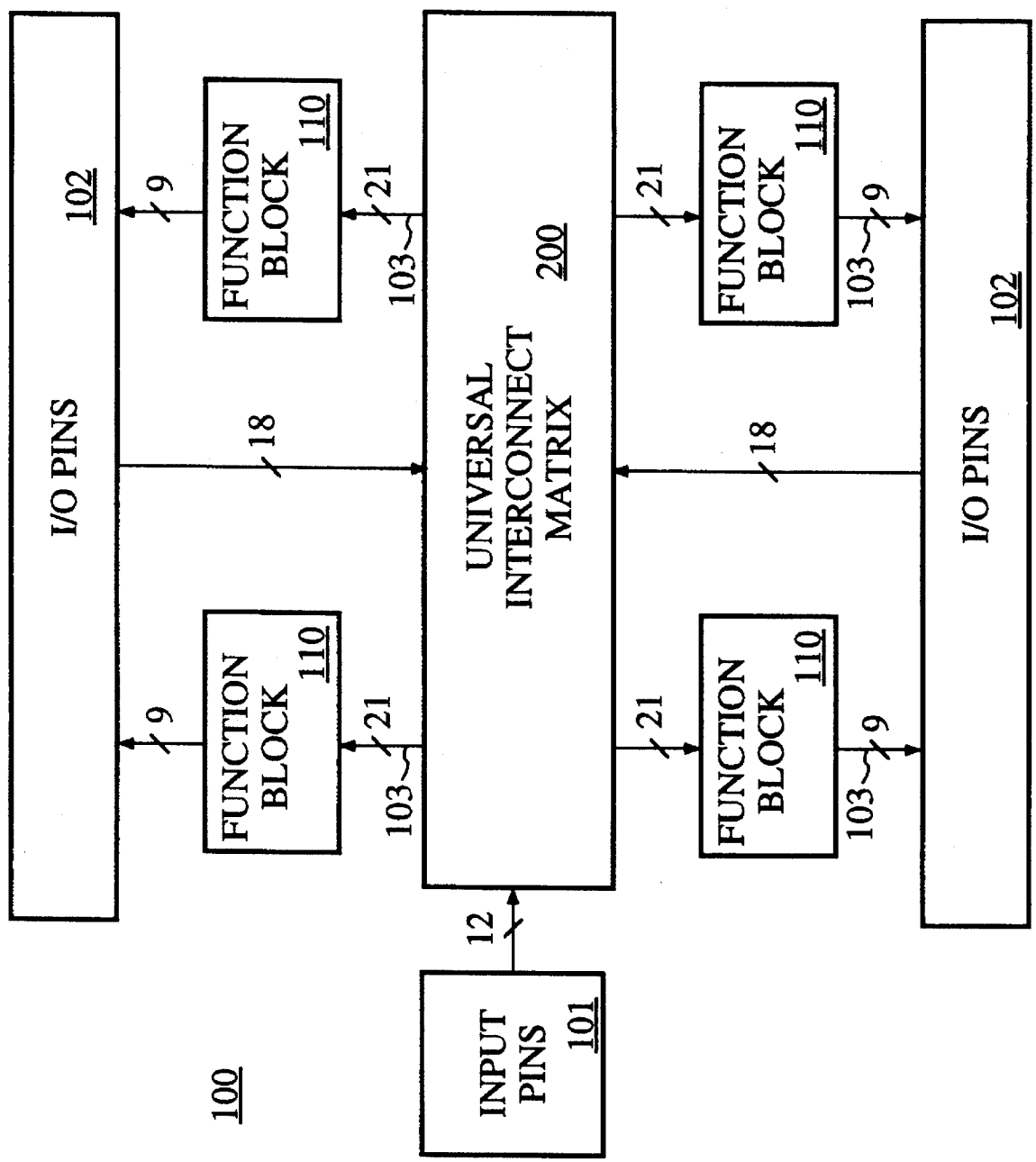
FIG. 1 is a circuit diagram showing an EPLD incorporating a UIM in accordance with the present invention.

FIG. 1 shows a simplified block diagram of an EPLD 100 incorporating the present invention. EPLD 100 includes a universal interconnect matrix (UIM) 200 having twenty-one input lines 103 connected to each function block 110. In one embodiment, each function block 110 is structured like the two-level PLDs described in detail above. Twelve input pins 101 and thirty-six bidirectional input/output (I/O) pins 102 also connect to UIM 200. Each function block 110 includes 9 output lines connected to I/O pins 102. Note that the numbers of input pins 101, I/O pins 102, and function blocks 110 provided above are exemplary. In one embodiment, the circuit structure of function blocks 110 is the AND/OR array structure described above with respect to the XC7000™ family of devices made by Xilinx, Inc. of San Jose, Calif. In that embodiment, connecting circuitry and input/output circuitry is also similar to that used in the XC7000 family of devices.

FIGS. 2, 5, 6 and 7 illustrate embodiments of UIM 200 of EPLD 100 shown in FIG. 1. These simplified EPLD structures include simplified connections between the input pads 101, I/Os 102, function blocks 110 and UIM 200, and omit circuitry which is unnecessary for describing UIMs 200(2), 200(5), 200(6) and 200(7) (FIGS. 2,5,6 and 7 respectively). It is understood that any of the UIMs 200(2), 200(5), 200(6) and 200(7) may be modified for implementation in EPLD 100 (FIG. 1) without changing the characteristics of these circuit structures.

Figure 2:
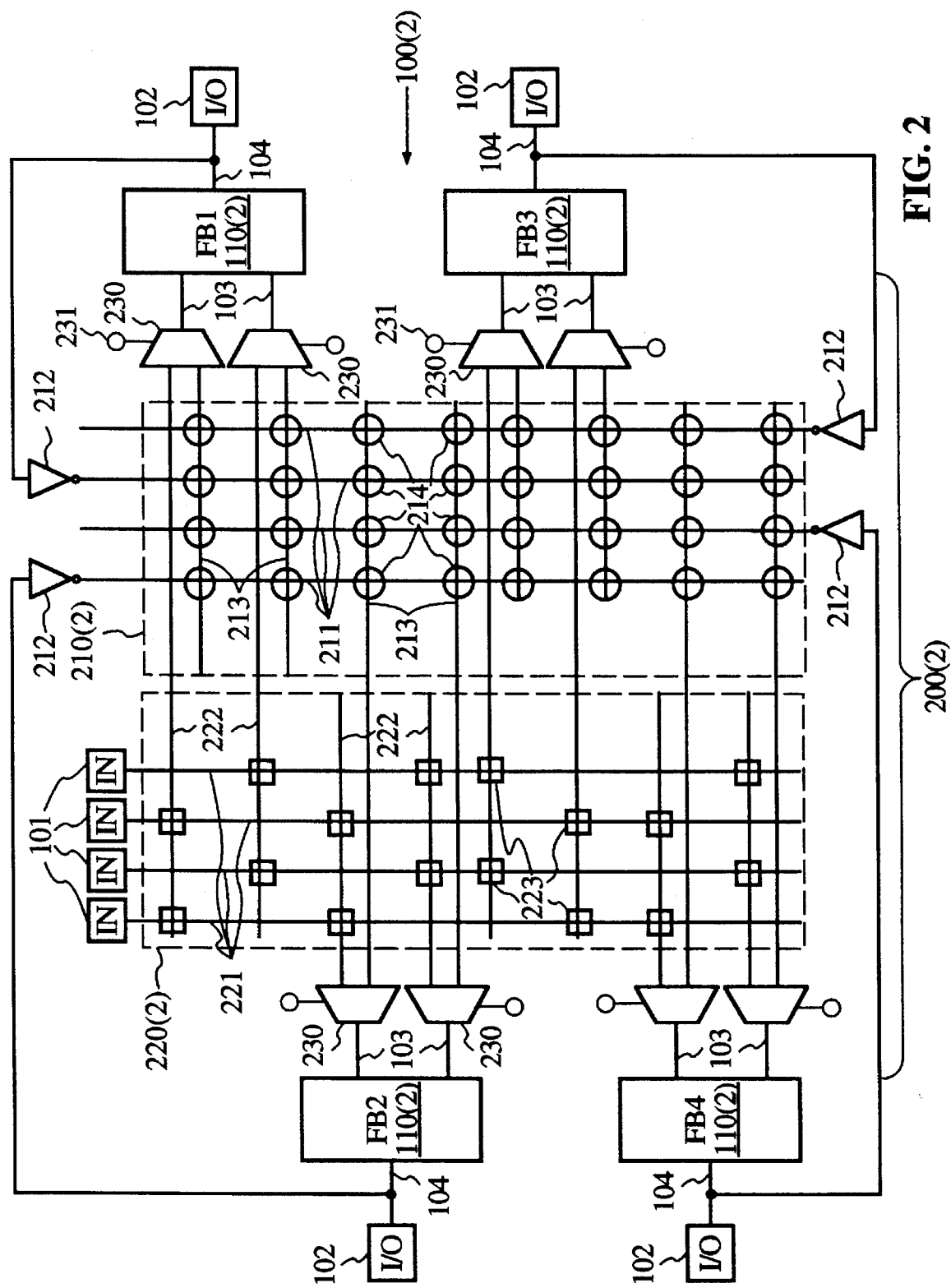
FIG. 2 is a circuit diagram showing a simplified EPLD incorporating a first embodiment of the present invention.

FIG. 2 shows a simplified EPLD 100(2) incorporating a UIM 200(2) in accordance with a first embodiment of the present invention. Simplified EPLD 100(2) includes four function blocks 110, wherein two function blocks 110 are located on each side of UIM 200(2). Input terminals 101 are provided for transmitting logic signals directly into UIM 200(2), and four input/output (I/O) terminals 102 function either as input or output terminals of EPLD 100(2). Each function block 110 includes two function block input lines 103 coupled to receive signals from UIM 200(2), and one function block output line 104 connected to one of I/O terminals 102. Each function block 110 includes programmable circuitry (not shown) capable of generating at its associated function block output line 104 a logic function of the signals applied at its function block input lines 103.

In accordance with the present invention, UIM 200(2) includes a cross-point circuit 210(2), a multiplexer-based (MUX-based) circuit 220(2), and a plurality of two-input multiplexers (MUXs) 230. In accordance with the first embodiment shown in FIG. 2, MUX-based circuit 220(2) is connected between input terminals 101 and a first input line of each two-input MUX 230. In addition, cross-point circuit 210(2) is connected between I/O terminals 102 and a second input line of each two-input MUX 230. As previously described, each two-input MUX 230 is connected via a line 103 to one of function blocks 110(2). Each MUX 230 is programmed via its programmable select element 231 (in one embodiment an EEPROM) to transmit either a logic signal from the cross-point circuit 210(2) or a logic signal from the MUX-based circuit 220(2) to its associated function block input line 103. In other embodiments of the present invention, other known switching circuits are used to perform the function of the above-described two-input MUXs 230.

In the following description of cross-point circuit 210(2) and MUX-based circuit 220(2), conductors are referred to as "vertical" or "horizontal". These designations are merely provided for convenience and refer to the orientation of the conductors shown in the figures. In practice, these conductors are oriented in any direction.

In the first embodiment, cross-point circuit 210(2) includes four vertical conductors 211, each vertical conductor being connected to one of I/O terminals 102 (and its associated function block output line 104) through an inverter 212 (described in detail below). Each vertical conductor 211 is programmably coupled to eight horizontal conductors 213 via a programmable element 214 (discussed in detail below). Each horizontal conductor 213 is connected to a first input terminal of a two-input MUX 230.

Figure 3:
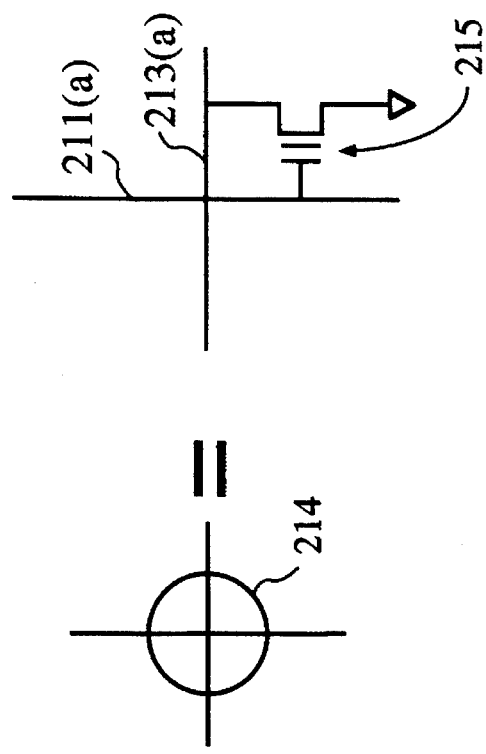
FIG. 3 is a circuit diagram showing a programmable connection associated with the cross-point circuit of the UIM.

FIG. 3 shows an example of a programmable element 214 used in cross-point circuit 210(2). In this embodiment, each programmable element 214 includes a conventional EEPROM cell 215 having a select (or control) gate connected to a vertical conductor 211(a), a drain connected to a horizontal conductor 213(a), and a source connected to ground. Each horizontal conductor 213 is connected to a voltage source (not shown). If EEPROM cell 215 is "erased" (i.e., responsive to signals on vertical conductor 211(a)), a high voltage applied to the select gate by vertical conductor 211(a) biases the EEPROM cell 215 to conduct, which connects horizontal conductor 213(a) to ground, thereby creating a low voltage level on horizontal conductor 213(a). Conversely, a low voltage on vertical conductor 211(a) causes erased EEPROM cell 215 to remain off; therefore, horizontal conductor 213(a) is maintained at a high voltage level by the voltage source (not shown). If EEPROM cell 215 is "programmed" (i.e., non-responsive to signals on vertical conductor 211(a)), the voltage level on horizontal conductor 213(a) does not change in response to the voltage level on vertical conductor 211(a).

Referring back to FIG. 2, because voltage levels appearing on horizontal conductors 213 are the inverse of signals on vertical conductors 211, inverters 212 are provided to invert signals before being applied to vertical conductors 211, thereby correcting logic signals at the input terminals of two-input MUXs 230. In an alternative embodiment, inverters 212 are located on horizontal conductors 213 between programmable elements 214 and two-input MUXs 230 to provide correct logic levels.

MUX-based circuit 220(2) includes four vertical conductors 221, each vertical conductor being connected to one input terminal 101. Each vertical conductor 221 is programmably connected to two of eight horizontal conductors 222 via programmable elements 223 (discussed below). Each horizontal conductor 222 is connected to a second input terminal of a two-input MUX 230.

Figure 4:
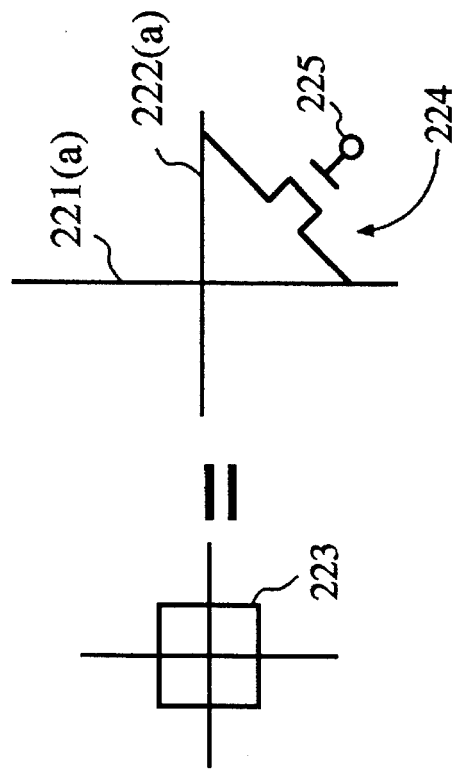
FIG. 4 is a circuit diagram showing a programmable connections associated with the MUX-based circuit of the UIM.

FIG. 4 shows one embodiment of a programmable element 223 of MUX-based circuit 220(2). Programmable element 223 includes a pass transistor 224 having a first terminal connected to a vertical conductor 221(a), a second terminal connected to a horizontal conductor 222(a), and a gate connected to a memory cell 225. In this embodiment, memory cell 225 is an EEPROM, although any other type of memory device is suitable. In operation, if memory cell 225 is "programmed" (i.e. provides a high signal to the gate of the pass transistor 224), pass transistor 224 is conducting and transfers a signal on vertical conductor 221(a) to horizontal conductor 222(a). That is, a high voltage or "logic 1" signal on vertical conductor 221(a) is transmitted through pass transistor 224 to horizontal conductor 222(a). Similarly, a low voltage or "logic 0" on vertical conductor 221 (a) results in a low voltage or "logic 0" on horizontal conductor 222(a). Conversely, if memory cell 225 is "erased" (i.e. provides a low signal to the gate of pass transistor 224) signals on vertical conductor 221(a) are blocked by pass transistor 224.

After EPLD 100(2) is programmed to perform a specific logic function, input signals applied to input terminals 101 are transmitted into UIM 200(2) on selected vertical conductors 221. Typically, several of programmable elements 223 connected to selected vertical conductors 221 are programmed to transmit the input signals to selected horizontal conductors 222. The signals are then transmitted from each selected horizontal conductor 222 to a selected function block input 103 through a two-input MUX 230. Similarly, input signals applied to I/O terminals 102 and feedback signals from the function block output lines 104 are inverted by inverters 212 and transmitted into UIM 200(2) on vertical conductors 211. Selected programmable elements 214 are programmed to respond to inverted signals present on selected vertical conductors 211 such that the original (re-inverted) signals are produced on one or more of the horizontal conductors 213. The re-inverted signals are then transmitted from each selected horizontal conductor 213 to a selected function block input 103 through a two-input MUX 230. Each two-input MUX 230 through which signals are transmitted to selected function blocks 100 must be programmed to pass either signals received from a horizontal conductor 213 or a horizontal conductor 222. In other words, only one of horizontal conductors 213 and 222 connected to the input lines of a given two-input MUX 230 may be used to transmit signals to the associated function block input line 103.

Note that, in addition to the logic performed by the function blocks 110, logic AND functions may be performed by the cross-point circuit 210. That is, signals on two or more vertical conductors 211 may be "ANDed" together by connecting these vertical conductors 211 to a common horizontal conductor 213 through associated programmable elements 214. However, this function is not provided by the MUX-based circuit 220.

Thus, an EPLD having a UIM in accordance with the present invention provides the following benefits. First, those skilled in the art will recognize that a certain percentage (about 85%) of all connections necessary to program an EPLD, such as EPLD 100 (FIG. 1), are provided using MUX-based circuit 220 of UIM 200 if the number of vertical conductors 221 equals the number of connections. In other words, there is a high probability that all signals provided to EPLD 100 are routable to appropriate function blocks 101 via programmable elements 223 provided in MUX-based circuit 220. Successful routing of any remaining signal connections is virtually assured by cross-point switch circuit 210 because each vertical conductor 211 is connectable to every horizontal conductor 213.

Figure 5:
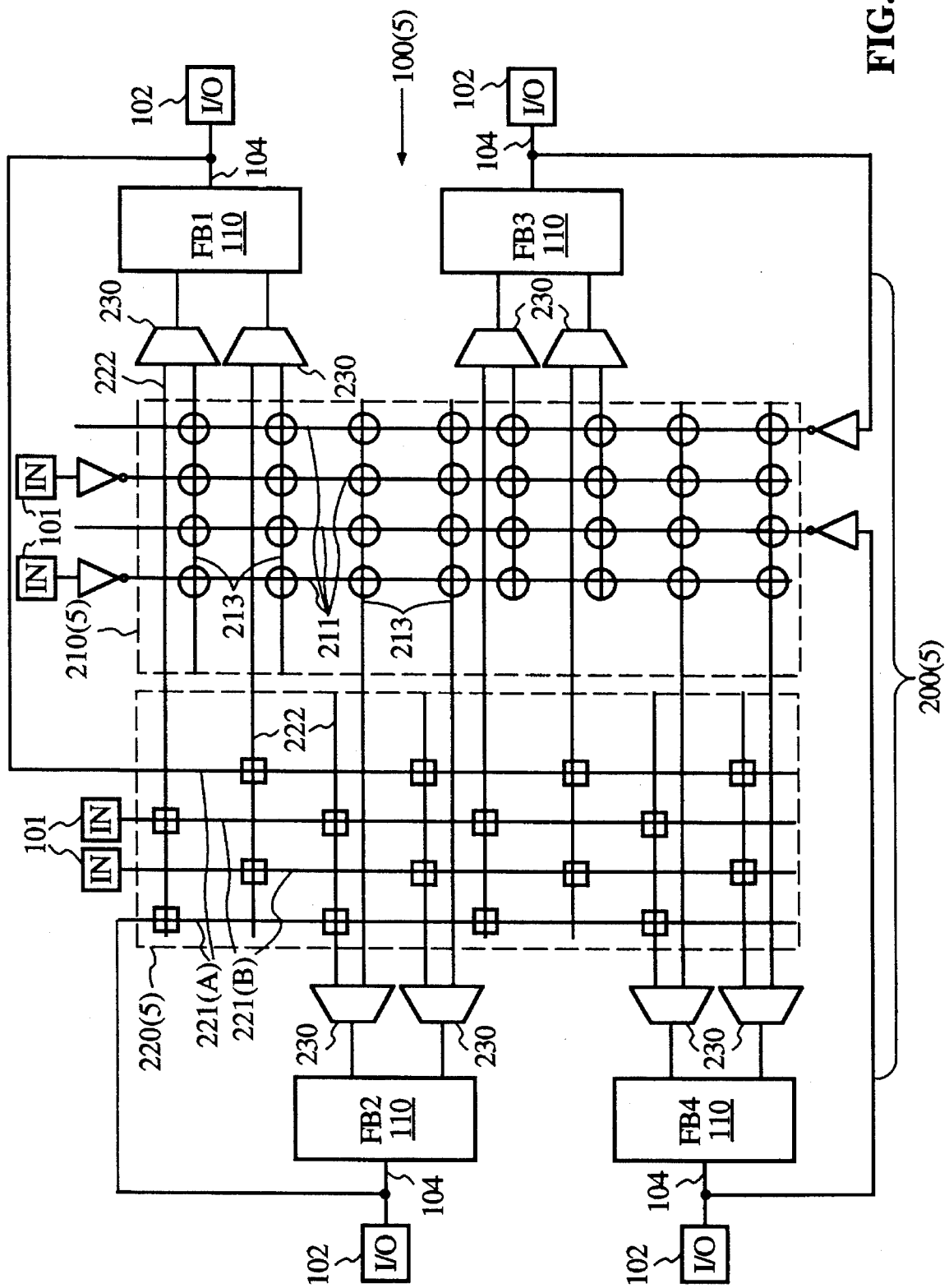
FIG. 5 is a circuit diagram showing a simplified EPLD incorporating a second embodiment of the present invention.
Figure 6:
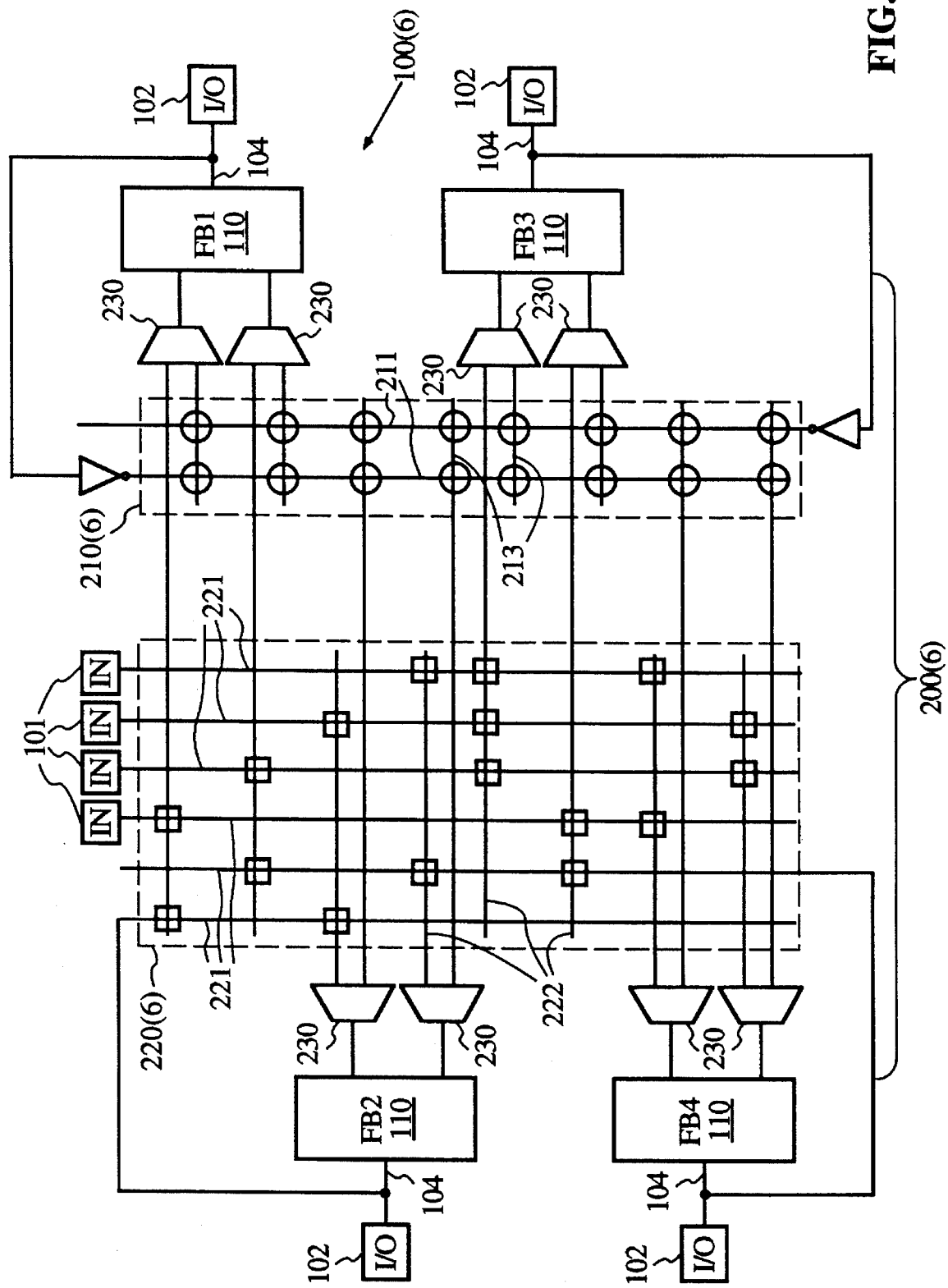
FIG. 6 is a circuit diagram showing a simplified EPLD incorporating a third embodiment of the present invention.
Figure 7:
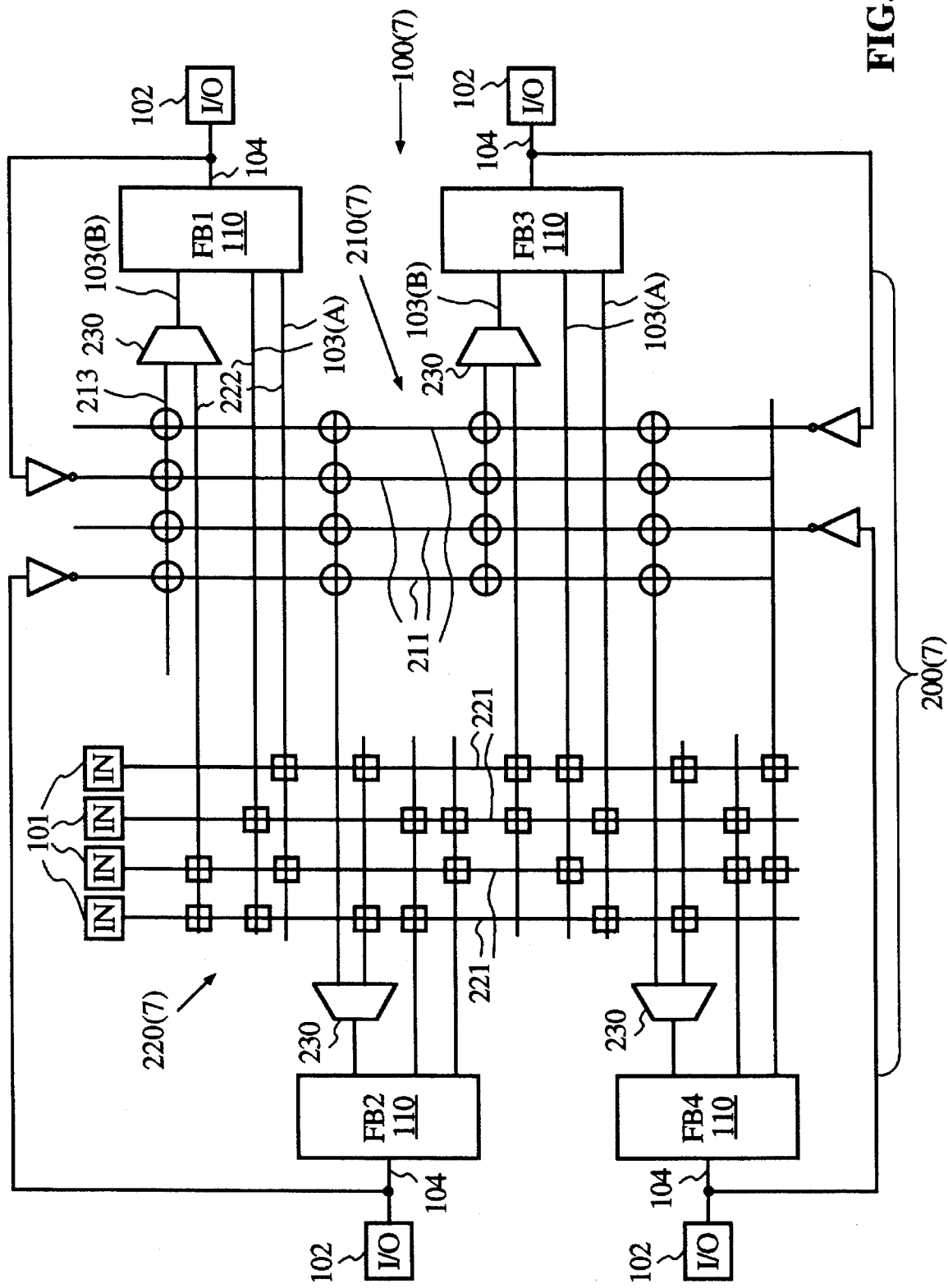
FIG. 7 is a circuit diagram showing a simplified EPLD incorporating a fourth embodiment of the present invention.

Additional embodiments of EPLDs incorporating the universal interconnect matrix 200 in accordance with the present invention are shown in FIGS. 5–7. Specifically, FIG. 5 shows a simplified EPLD 100(5) which includes an UIM 200(5) according to a second embodiment of the present invention. Similar to UIM 200(2) of FIG. 2, UIM 200(5) includes both a cross-point circuit 210(5), a MUX-based circuit 220(5), and two-input MUXs 230 connected to horizontal conductors 213 and 222 of the cross-point circuit 210(5) and the MUX-based circuit 220(5), respectively.

EPLD 100(5) differs from EPLD 100(2) in that two of input terminals 101 of EPLD 100(5) are connected to the cross-point circuit 210(5), and two of input terminals 101 are connected to vertical conductors 221(B) of MUX-based circuit 220(5). Similarly, two of function block output lines 104 are connected to cross-point circuit 210(5), and two of function block output lines 104 are connected to vertical conductors 222(B) of MUX-based circuit 220(5). This configuration shows that the connections between the different sources of logic signals entering UIM 200 are not restricted by the input source to enter one or the other of cross-point circuit 210 and MUX-based circuit 220. Specifically, some or all of the input signals are connectable to cross-point circuit 210, and some or all of the feedback signals from function blocks 110 are connectable to MUX-based circuit 220.

FIG. 6 shows a simplified EPLD 100(6) which includes an UIM 200(6) according to a third embodiment of the present invention. UIM 200(6) includes both a cross-point circuit 210(6), a MUX-based circuit 220(6), and two-input MUXs 230 connected to horizontal conductors 213 and 222 of cross-point circuit 210(6) and MUX-based circuit 220(6), respectively.

EPLD 100(6) differs from EPLDs 100(2) and 100(5) in that the number of vertical conductors 211 of cross-point circuit 210(6) differs from the number of vertical conductors 221 of MUX-based circuit 220(6). For example, cross-point circuit 210(6) is shown with two vertical conductors 211, and MUX-based circuit 220(6) is shown with six vertical conductors 221. As indicated, the overall size of UIM 200(6) is approximately the same or reduced by this arrangement. Further, the number of connections routable through the fast MUX-based circuit 220(6) is increased, thereby increasing the speed of an implemented logic function, while maintaining a smaller cross-point circuit 210(6) to ensure nearly 100% routability. In other embodiments, UIM 200 includes a larger number of vertical conductors in cross-point circuit 210 than in MUX-based circuit 220 if greater probability of 100% routability is desired. However, this configuration requires a larger number of signals to be implemented by cross-point circuit 210, thereby reducing the operating speed of EPLD 100.

FIG. 7 shows a simplified EPLD 100(7) which includes an UIM 200(7) according to a fourth embodiment of the present invention. UIM 200(7) includes both a cross-point circuit 210(7), a MUX-based circuit 220(7), and two-input MUXs 230 connected to horizontal conductors 213 and 222 of cross-point circuit 210(7) and MUX-based circuit 220(7), respectively. EPLD 100(7) differs from the above-described embodiments in that each function block 110 includes one or more function block input 103(A) connected directly to a horizontal conductor 222 of MUX-based circuit 230 (that is, not through a two-input MUX 230), and one (or more) input 103(B) connected to the output line of a two-input MUX 230. In the disclosed simplified embodiment, one function block input line 103(B) of each function block 110 is connected to the output line of a two-input MUX 230, and two function block input lines 103(B) of each FB 110 are connected directly to a horizontal conductor 222 of MUX-based circuit 220(7). Similar to the third embodiment shown in FIG. 6, this arrangement increases the number of connections to the faster MUX-based circuit 220(7) and allows a reduction in the size of cross-point circuit 210(7). Of course, function block input lines 103 are connectable directly to horizontal conductors 213 of the cross-point circuit 210.

Programming of an EPLD 100 incorporating UIM 200 will now be discussed.

Figure 8:
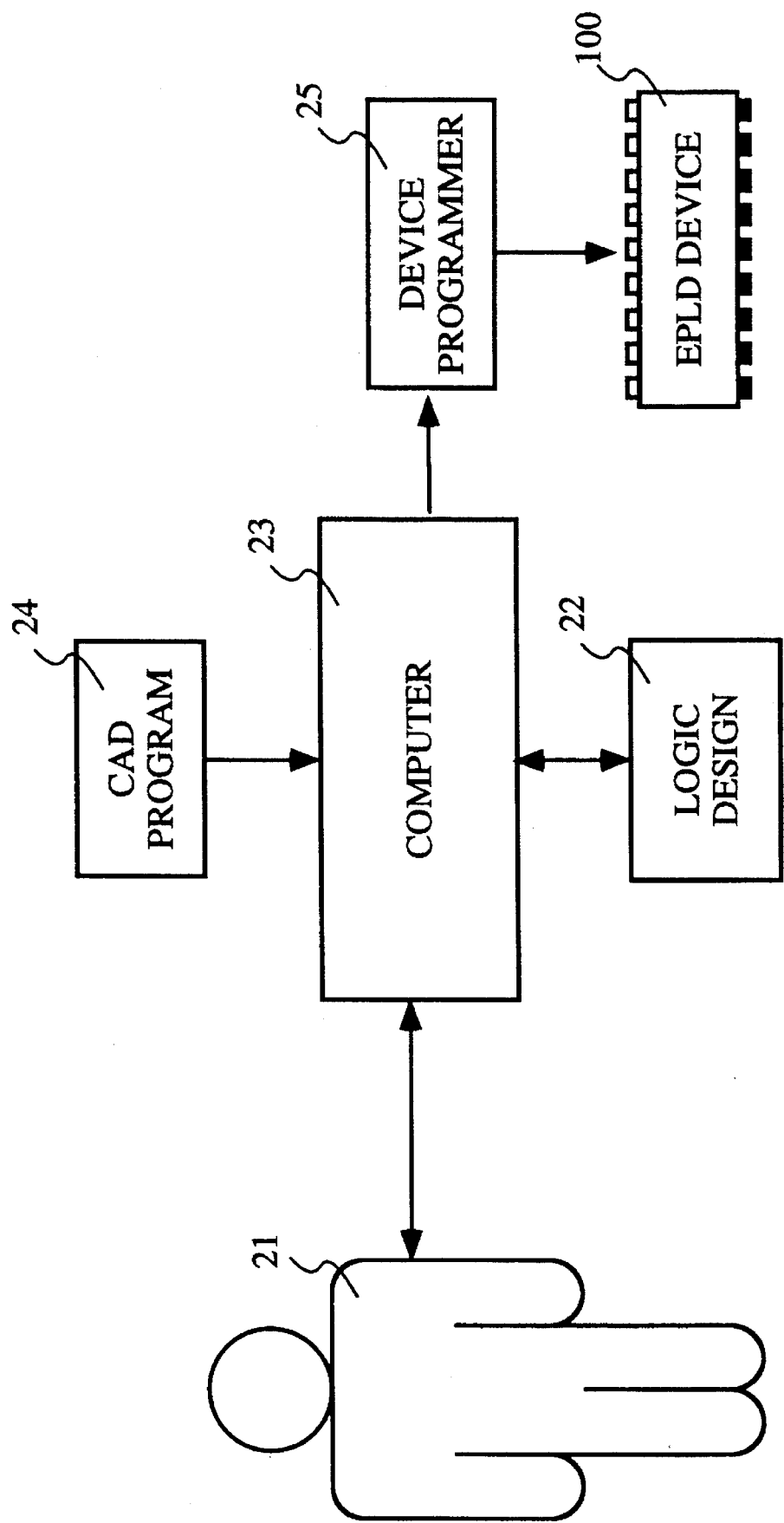
FIG. 8 is a diagram showing an arrangement for programming an EPLD in accordance with the present invention.

FIG. 8 shows a "machine" for programming an EPLD 100 in accordance with another aspect of the present invention. A human user 21 provides EPLD 100 to be programmed and specifies the logic function (circuit design) which EPLD 100 is to implement. Logic design software 22 and CAD software 24, operating in a computer 23, take the logic function specified by user 21 and determine how to map the logic efficiently onto EPLD 100. Logic design software 22 is used to carry out the steps shown in FIGS. 9(A) and 9(B), and described further below. If the specified logic function is represented in a schematic or high-level language format, logic design software 22 is used to transform the function from that format to a Boolean sum-of-products form prior to carrying out the steps in FIGS. 9(A) and 9(B). Such format transformation procedures are well known in the art and are readily available. The procedure in FIGS. 9(A) and 9(B), however, is particular to the present invention. CAD software 24 is used after the logic design software 22, and produces a bit-map file that indicates to a device programmer 25 the values to program into EPLD 100. This bit-map file, also known as a hex file or a JEDEC fusemap, is a list of the programmable connections of the AND-array of each function block, of the logic expander or interconnect matrix, and other setting of EPLD 100. Device programmer 25 physically programs the contents of the bit-map file into EPLD 100. The physical form of the programming or configuring depends on the manufacturing technology of EPLD 100.

For example, if EPLD 100 is an EPROM or EEPROM device, the EPROM or EEPROM cells are programmed by charging or discharging a floating gate or other capacitance element. Other PLD devices may be programmed using similar device programmers by blowing fuses. One illustrative device programmer 25 is an HW130 programmer, available from Xilinx Inc., which connects to computer 23 via an RS232 serial port. A software driver, such as a software program called Prolink™, also available from Xilinx Inc., downloads the programs and data from computer 23 to device programmer 25. Thus, the interacting elements 21–25 of the machine in FIG. 8 carry out a process that transforms EPLD 100 from an unprogrammed state to a programmed state that performs the specified logic function.

Figure 9A:
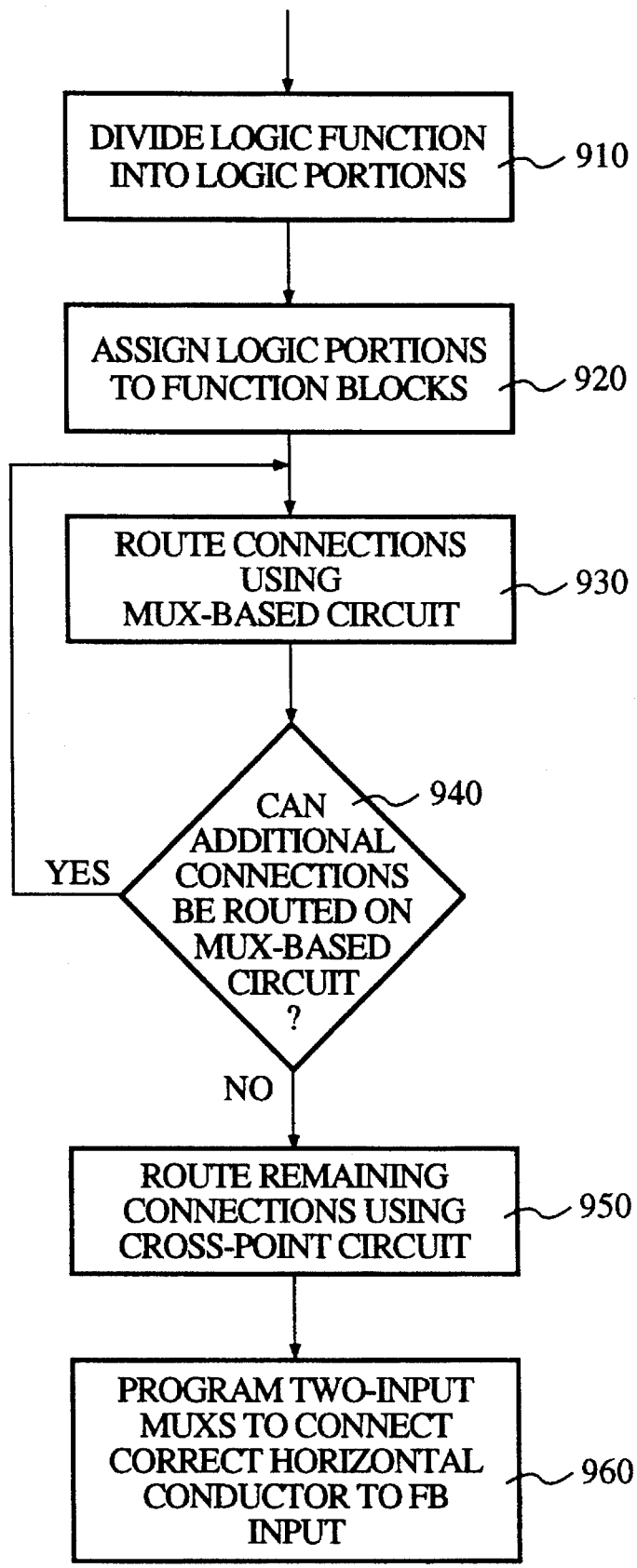
FIG. 9A is a flow diagram showing a method for selecting a connection in an EPLD in accordance with the present invention.

Referring to FIG. 9A, a method for mapping an EPLD 100 including an UIM 200 in accordance with the present invention includes (in step 910) dividing a desired logic function into logic portions which are implemented into the function blocks 110. After forming logic portions, (in step 920) the logic portions are assigned to specific function blocks, thereby defining connections between the function blocks 110, the input terminals 101 and the I/O terminals 102 which are necessary to carry out the logic function. Note that the software necessary to carry out the above-described steps 910 and 920 is commercially available, and these steps are mentioned as a point of reference. In accordance with the present invention, (in step 930) initial routing of the defined connections takes place using resources provided by MUX-based circuit 220. When (in step 940) it is determined that routing additional connections using MUX-based circuit 220 is impractical, then (in step 950) any remaining connections are routed using the resources of cross-point circuit 210. Finally, (in step 960) the programmable elements 231 associated with two-input MUXs 230 are programmed to connect the appropriate horizontal conductors 213 and 222 to function block input lines 103. The above-described programming method ensures a high percentage of connections are routed using the faster MUX-based circuit, thereby maximizing the operating speed of the programmed EPLD 100.

Figure 9B:
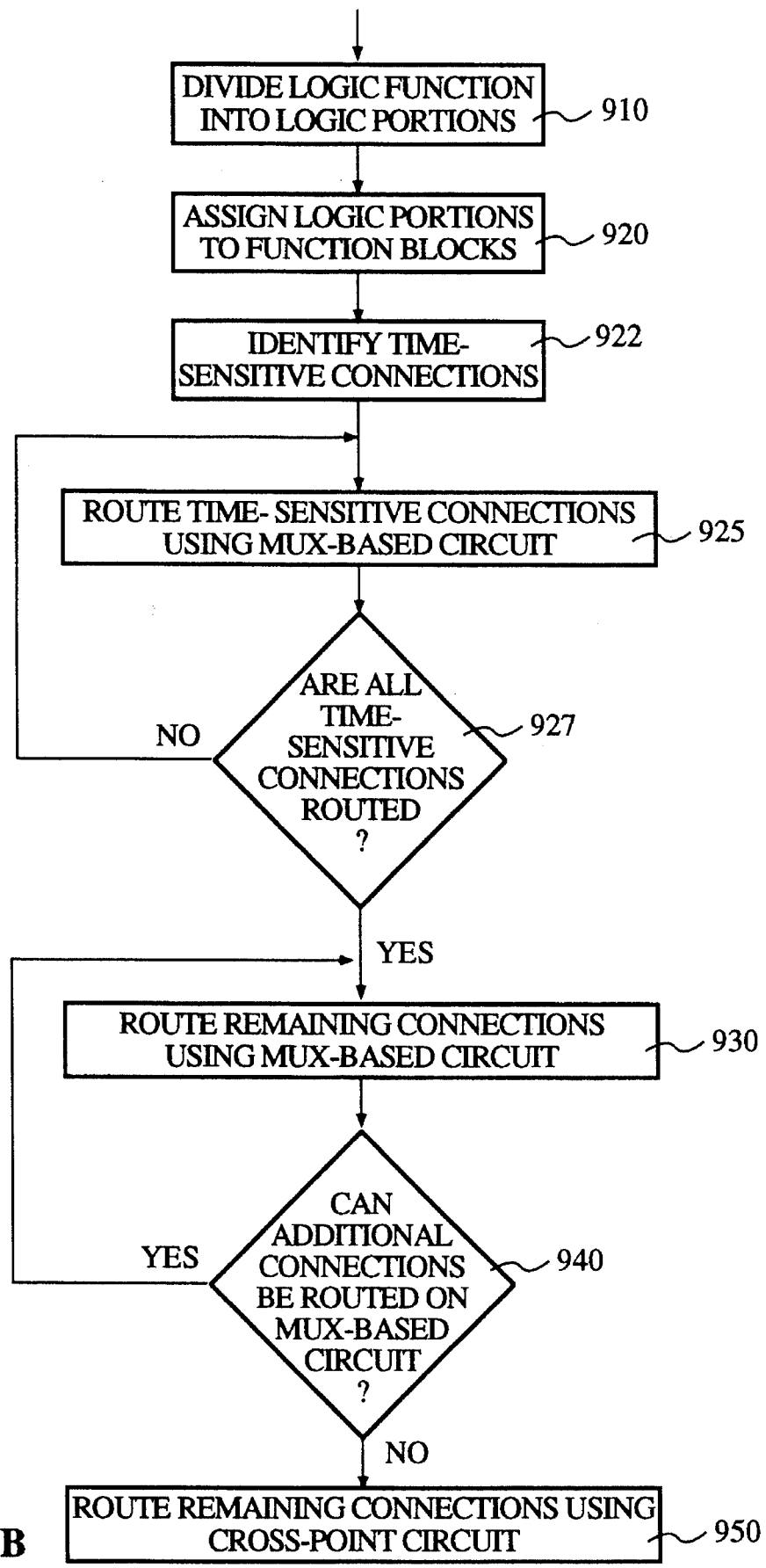
FIG. 9B is a flow diagram showing an alternative method for selecting a connection in an EPLD in accordance with the present invention.

FIG. 9B shows an alternative method of mapping an EPLD 100 including an UIM 200 in accordance with another aspect of the present invention. The alternative method includes steps 910 and 920, described above. However, the defined connections are then (in step 922) divided into "time-sensitive" connections and "non-time-sensitive" connections. "Time-sensitive" connections are connections requiring a relatively faster propagation time through EPLD 100 than other "non-time-sensitive" connections. As mentioned above, the propagation of signals through MUX-based circuit 220 is recognized as being faster than through cross-point circuit 210. As such, (in step 925) these time-sensitive connections are routed in MUX-based circuit 220 first. When (in step 927) all of these time-sensitive connections are routed, (in step 930) the remaining non-time-sensitive connections are routed using the remaining resources of MUX-based circuit 220. Finally, after every practical resource of MUX-based circuit 220 has been used, (in step 950) any remaining connections are routed using cross-point circuit 210. The added benefit of the above-described alternative method is that it assures that the time-sensitive connections are routed on the faster MUX-based circuit 220.

Although the present invention has been described in considerable detail with reference to certain embodiments thereof, other embodiments are possible. For example, the above-described programmable elements associated with the UIM 200 are described as EEPROM cells. Those skilled in the art will recognize that these elements can be replaced with EPROMs, flash EPROMs, SRAMs, fuses, antifuses, or any other type of memory cell. Further, in most of the disclosed embodiments horizontal conductors 222 of MUX-based circuit 220 are connected to only two vertical conductors 221. However, the number of such connections per horizontal conductor 222 may be increased, although the speed of signals transmitted by MUX-based circuit 220 is reduced as the number of connections is increased. Therefore, the spirit and scope of the appended claims should not be limited to the description of the embodiments contained herein.

We claim:

1. A programmable logic device comprising:
    a plurality of function blocks, each function block including a set of input lines and an output line, each function block being programmable to perform logic functions based on selected signals on said set of input lines; and
    a universal interconnect matrix including:
        a first circuit including a plurality of first conductors and a plurality of second conductors, each of said plurality of first conductors being programmably associated with each of said plurality of second conductors;
        a second circuit including a plurality of third conductors and a plurality of fourth conductors, each of said plurality of fourth conductors being programmably connected to a selected subset of said plurality of third conductors; and
        a plurality of third circuits, each third circuit having a first input line connected to one of said plurality of second conductors, a second input line connected to one of said plurality of fourth conductors, and an output line connected to one of said set of input lines of a selected function block.

2. The programmable logic device according to claim 1 further comprising a plurality of input terminals, wherein at least one of said plurality of first conductors is connected to one of said input terminals.

3. The programmable logic device according to claim 2 further comprising an inverter connected between said one of said input terminals and said at least one of said plurality of first conductors.

4. The programmable logic device according to claim 1 wherein at least one of said plurality of first conductors is connected to the output line of one of said plurality of function blocks.

5. The programmable logic device according to claim 4 further comprising an inverter connected between the output line of said one of said plurality of function blocks and said at least one of said plurality of first conductors.

6. The programmable logic device according to claim 1 further comprising a plurality of input terminals, wherein at least one of said plurality of third conductors is connected to one of said input terminals.

7. The programmable logic device according to claim 1 wherein at least one of said plurality of second conductors is connected to one of the input lines of one of said plurality of function blocks.

8. The programmable logic device according to claim 1 wherein programmable associations between said plurality of first conductors and said plurality of second conductors are provided by electrically programmable elements, each electrically programmable element having a gate connected to one of said plurality of first conductors, a drain connected to one of said plurality of second conductors, and a source connected to ground.

9. The programmable logic device according to claim 1 wherein programmable connections between said plurality of third conductors and said plurality of fourth conductors are provided by pass-gates, each pass-gate having a first terminal connected to one of said plurality of third conductors, a second terminal connected to one of said plurality of fourth conductors, and a gate connected to a memory cell, wherein a conductive state of the pass-gate is determined by a programmed state of said memory cell.

10. The programmable logic device according to claim 9 wherein said memory cell is an EEPROM cell.

11. The programmable logic device according to claim 9 wherein said memory cell is an EPROM cell.

12. The programmable logic device according to claim 1 wherein each third circuit is a multiplexer including a select circuit for selectively transmitting to said output line a signal received by one of said first input lines and said second input lines, said select circuit comprising a memory cell connected to a select input line of said multiplexer.

13. The programmable logic device according to claim 12, wherein said memory cell is an EPROM cell.

14. The programmable logic device according to claim 12, wherein said memory cell is an EEPROM cell.

15. The programmable logic device according to claim 1 wherein the number of said plurality of third conductors of said second circuit is greater than the the number of said plurality of first conductors of said first circuit.

16. The programmable logic device according to claim 1 wherein each function block includes a first input line connected directly to said plurality of fourth conductors, and a second input line connected to the output line of one of said third circuits.

17. A programmable logic device comprising:
- a function block including an input line, each function block being programmable to perform logic functions based on a signal received on the input line; and
- a universal interconnect matrix including:
  - a first circuit including a first conductor programmably connected to a second conductor by an electrically programmable element, the electrically programmable element having a gate connected to the first conductor, a drain connected to the second conductor, and a source connected to ground; and
  - a second circuit including a third conductor programmably connected to a fourth conductor by a pass-gate, the pass-gate having a first terminal connected to the third conductor, a second terminal connected to the fourth conductor, and a gate connected to a memory cell, wherein a conductive state of the pass-gate is determined by a programmed state of the memory cell.

18. The programmable logic device according to claim 17, further comprising:
- means for selectively connecting one of the second conductor and the fourth conductor to the input line of the function block;
- wherein the connecting means comprises a multiplexer having a first input line connected to the second conductor, a second input line connected to the fourth conductor, an output line connected to the input line of the function block, and a select circuit for selectively transmitting to the output a signal received by one of the first input line and the second input line, the select circuit comprising a memory cell connected to a select input line of the multiplexer.

19. A method for programming a programmable logic device to implement a logic function, the programmable logic device including a plurality of input terminals, a plurality of function blocks, and a universal interconnect circuit for providing selected connections between the input terminals and the function blocks, each function block including a set of input lines and an output line, each function block being programmable to perform logic operations based on the signals on selected ones of the set of input lines, the universal interconnect matrix including:
- a first circuit including a plurality of first conductors and a plurality of second conductors, each of plurality of first conductors being programmably connected to each of the plurality of second conductors,
- a second circuit including a plurality of third conductors and a plurality of fourth conductors, each of the plurality of fourth conductors being programmably connected to a selected subset of the plurality of third conductors, and
- a plurality of third circuits, each third circuit having a first input line connected to one of the plurality of second conductors, a second input line connected to one of the plurality of fourth conductors, an output line connected to one of the set of input lines of a selected function block; the method comprising:
  - dividing the logic function into logic portions;
  - assigning each logic portion to one of the plurality of function blocks;
  - routing selected third and fourth conductors to provide connections between the input terminals and the function blocks such that every possible connection associated with the logic function is implemented by the second circuit;
  - routing any remaining connections associated with the logic function using selected first and second conductors of the first circuit.

20. The method according to claim 19, further comprising the steps of:
- dividing the connections into time-sensitive connections and non-time-sensitive connections;
- wherein the step of routing selected third and fourth conductors includes routing the time-sensitive connections, then routing the non-time-sensitive connections.

21. The method according to claim 19 further comprising programming the plurality of third circuits such that each third circuit transmits to its output line a signal from one of a second conductor connected to its first input line and a fourth conductor connected to its second input line.

22. A method for programming a programmable logic device to implement a logic function, the programmable logic device including a plurality of input terminals, a plurality of function blocks, and a universal interconnect circuit for providing selected connections between the input terminals and the function blocks, each function block including a set of input lines and an output line, each function block being programmable to perform logic operations based on the signals on selected ones of the set of input lines, the universal interconnect matrix including:
- a first circuit including a first conductor programmably connected to a second conductor by an electrically programmable element, the electrically programmable element having a gate connected to the first conductor, a drain connected to the second conductor, and a source connected to ground; and
- a second circuit including a third conductor programmably connected to a fourth conductor by a pass-gate, the pass-gate having a first terminal connected to the third conductor, a second terminal connected to the fourth conductor, and a gate connected to a memory cell, wherein a conductive state of the pass-gate is determined by a programmed state of the memory cell;
- the method comprising:
  - dividing the logic function into logic portions;
  - assigning each logic portion to one of the plurality of function blocks;
  - routing selected third and fourth conductors to provide connections between the input terminals and the function blocks such that every possible connection associated with the logic function is implemented by the second circuit;
  - routing any remaining connections associated with the logic function using selected first and second conductors of the first circuit.

23. The method according to claim 22, further comprising the steps of:
- dividing the connections into time-sensitive connections and non-time-sensitive connections;
- wherein the step of routing selected third and fourth conductors includes routing the time-sensitive connections, then routing the non-time-sensitive connections.

* * * * *